United States Patent
Pope et al.

(10) Patent No.: US 10,875,052 B2
(45) Date of Patent: Dec. 29, 2020

(54) METHOD AND APPARATUS FOR PRODUCING LARGE-AREA MONOLAYER FILMS OF SOLUTION DISPERSED NANOMATERIALS

(71) Applicants: Michael A. Pope, Kitchener (CA); Xu Luzhu, Waterloo (CA); Yefeng Zhang, Toronto (CA)

(72) Inventors: Michael A. Pope, Kitchener (CA); Xu Luzhu, Waterloo (CA); Yefeng Zhang, Toronto (CA)

( * ) Notice: Subject to any disclaimer, the term of this patent is extended or adjusted under 35 U.S.C. 154(b) by 0 days.

(21) Appl. No.: 16/308,647

(22) PCT Filed: Jun. 9, 2017

(86) PCT No.: PCT/CA2017/050705
§ 371 (c)(1),
(2) Date: Dec. 10, 2018

(87) PCT Pub. No.: WO2017/219125
PCT Pub. Date: Dec. 28, 2017

(65) Prior Publication Data
US 2019/0270113 A1    Sep. 5, 2019

Related U.S. Application Data

(60) Provisional application No. 62/392,733, filed on Jun. 10, 2016.

(51) Int. Cl.
*B05D 1/20* (2006.01)
*B82Y 30/00* (2011.01)
(Continued)

(52) U.S. Cl.
CPC ............ *B05D 1/204* (2013.01); *B05D 1/208* (2013.01); *B29C 41/08* (2013.01); *B29C 41/12* (2013.01);
(Continued)

(58) Field of Classification Search
CPC .............................. B82Y 30/00; B82Y 40/00
See application file for complete search history.

(56) References Cited

U.S. PATENT DOCUMENTS

| 2007/0284557 A1 | 12/2007 | Gruner |
| 2010/0092809 A1 * | 4/2010 | Drzal ................. H01M 4/0416 |
| | | 429/413 |

(Continued)

FOREIGN PATENT DOCUMENTS

| WO | WO 2016057109 | 4/2016 |
| WO | WO-2016057109 A2 * | 4/2016 ........... C01B 32/192 |
| WO | WO 2016094384 | 6/2016 |

OTHER PUBLICATIONS

Kinge, Self-Assembling Nanoparticles at Surfaces and Interfaces, 2008, ChemPhysChem, vol. 9, pp. 20-42. (Year: 2008).*

(Continued)

*Primary Examiner* — Monique R Jackson
(74) *Attorney, Agent, or Firm* — Brunet & Co. Ltd.; Robert Brunet; Hans Koenig (57) ABSTRACT

The disclosure is directed at a large-area monolayer of solvent dispersed nanomaterials and method of producing same. The method of the disclosure includes dripping a nanomaterial solvent into a container filled with water whereby the nanomaterial being dripped collects at the air-water interface to produce the large-area monolayer. In one embodiment, different nanomaterial solvents can be dripped, at predetermined intervals such that the resulting large-area monolayer includes at least two different nanomaterials.

8 Claims, 7 Drawing Sheets

(51) Int. Cl.
*B82Y 40/00* (2011.01)
*B29C 41/12* (2006.01)
*B29C 41/08* (2006.01)
*C30B 33/06* (2006.01)
*C30B 29/02* (2006.01)
*C30B 7/14* (2006.01)

(52) U.S. Cl.
CPC .............. *C30B 29/02* (2013.01); *C30B 33/06* (2013.01); *B05D 1/206* (2013.01); *B82Y 30/00* (2013.01); *B82Y 40/00* (2013.01); *C30B 7/14* (2013.01); *Y10S 438/939* (2013.01); *Y10T 428/25* (2015.01); *Y10T 428/261* (2015.01); *Y10T 428/268* (2015.01)

(56) References Cited

U.S. PATENT DOCUMENTS

| | | | |
|---|---|---|---|
| 2012/0040164 A1* | 2/2012 | Lee | ............ B05D 1/20 428/220 |
| 2013/0244009 A1* | 9/2013 | Jesudoss | ................ B41C 1/00 428/195.1 |
| 2014/0056800 A1 | 2/2014 | Kobayashi | |

OTHER PUBLICATIONS

Szabo, Hybrid Langmuir-Blodgett monolayers of graphite oxide nanosheets, 2010, Carbon 48, pp. 1676-1681; and Online Appendix A. Supplementary data (at doi:10.1016/j.carbon.2009.12.050). (Year: 2010).*

Finn, Inkjet deposition of liquid-exfoliated graphene and MoS2 nanosheets for printed device applications, Dec. 2013, Journal of Materials Chemistry C, vol. 2, pp. 925-932; and Electronic supplementary information (at DOI:10.1039/c3tc31993h). (Year: 2013).*

International Search Report and Written Opinion on PCT Application No. PCT/CA2017/050705, dated Sep. 6, 2017.

International Preliminary Report on Patentability on PCT Application No. PCT/CA2017/050705, dated Dec. 11, 2018.

Xue Li and James F. Gilchrist. Langmuir 2016, 32, 1220-1226.

Coté LJ, et al. J. Am. Chem. Soc. 2009, 131, 1043-1049 9 1043.

Extended European Search Report dated Jan. 13, 2020 on European application 17814365.7.

* cited by examiner

METHOD AND APPARATUS FOR PRODUCING LARGE-AREA MONOLAYER FILMS OF SOLUTION DISPERSED NANOMATERIALS

CROSS REFERENCE TO OTHER APPLICATIONS

This application claims priority from U.S. Provisional Application No. 62/392,733 filed Jun. 10, 2016, which is hereby incorporated by reference.

FIELD OF THE DISCLOSURE

The disclosure is generally directed at nanomaterials and, more specifically, at a method and apparatus for producing large-area monolayer of solution dispersed nanomaterials.

BACKGROUND OF THE DISCLOSURE

There has been growing interest in the use of a variety of two-dimensional (2D) materials such as graphene, graphene oxide (GO), hexagonal boron nitride (HBN) transition metal dichalcognides (TMDs) such as molybdenum disulfide (MoS2), and more recently silicine and phosphorene. These materials have a range of unique properties and may be used to form a complete set of electronic materials including conductors, semiconductors (direct and indirect band gap) and insulators which can, in principle, be arranged in various ways to build advanced electronic and optoelectronic circuits. Furthermore, single layers of these materials can be used as transparent conductors, blocking layers for food packaging or corrosion protection, or as selective membranes. The use of 2D nanomaterials in these applications requires the development of processing methods to deposit uniform thin films over large area and with fine control over film thickness or layer number. One of the most common film forming technologies is chemical vapor deposition (CVD) that relies on expensive, high vacuum machinery. For example, growth of graphene by vapor deposition is limited to a small set of substrates such as copper or SiC and requires tedious, error-prone steps to transfer films to other substrates such as plastics or glass. Furthermore, the ability to grow 2D nanomaterials with controlled layer number remains a challenge.

On the other hand, there exist approaches based on the exfoliation of bulk precursors to create 2D nanomaterials. These approaches result in nanometer thick sheets of materials with large polydispersity in their lateral dimensions—typically ranging from 100 nm to 100 µm in effective diameter. So far, the greatest control in forming large-area thin films from such materials has been through use of a Langmuir trough and the Langmuir-Blodgett technique to create well-controlled films of graphene oxide at the air-water interface.

However, a limitation of this approach is that mechanical barriers must be used to compress the floating graphene oxide sheets to create the densely tiled film. Compression of the film is necessary because the floating graphene oxide sheets are known to be repulsive due to their negatively charged edges. In this approach, the dense film is typically about ⅕th the area of the total coating bath after compression with the moveable barriers. Because of the need to compress the film, there is no way to continuously add material to the coating bath and thus the substrate to be coated is limited by the size of the trough (i.e., the trough must be five times larger than the substrate to be coated).

Due to the same limitation, there is no way to create patterned films with different 2D materials in the same coating bath. Although this method yields fine control over film density and layer thickness, it is not amenable to roll-to-roll fabrication process. A modification to the Langmuir-Blodgett approach was recently developed to create films on the order of 100 nm to 100 µm to form thin films of polymers or nanoparticles. This further approach holds promise for polymer thin films and monodispersed micron-sized nanoparticles. However, it does not provide a method suitable for creating well-defined thin films of 2D nanomaterials with significant polydispersity in terms of their lateral size because the method requires that the nanoparticle be entrained in a liquid film which is thinner than the particle dimension for the formation of a monolayer. Liquid films are not stable at the small length scales (few nanometers) necessary to entrain 2D nanomaterials.

Film forming approaches based on chemical vapour deposition are also capable of producing continuous sheets of various 2D materials such as graphene. A known roll-to-roll coating method based on vapour deposition incorporates graphene into transparent displays and touch screens. However, this method requires expensive, high vacuum equipment and tedious transfer steps. Furthermore, this method can only be carried out on a few select growth substrates such as Cu and SiC. Using this method, it is not possible to grow patterned films of multiple materials and it remains challenging to produce multi-layered films with different materials as they would each require a different CVD system and growth substrate.

Ink-jet printing, vacuum filtration and spin coating of graphene-based and other 2D materials, are common deposition approaches to make thicker films. Due to the statistical nature of nanomaterial aggregation during these processing approaches, it is not possible to create dense, continuous, thin films on the nanometer length scale. These technologies are only capable of producing defect-free thin films down to a thickness of about 50-100 nm. With the exception of ink-jet printing, these processes also cannot be used to create well-defined patterns from a variety of materials.

Despite the various approaches proposed, there remains a need for an economical and scalable method of creating 2D nanomaterial films with fine control over thickness and uniformity.

Therefore, there is provided a novel large-area monolayer of solution dispersed nanomaterials and method and apparatus for producing same.

SUMMARY OF THE DISCLOSURE

The disclosure is directed at a large-area monolayer of solution dispersed nanomaterials and method of producing same. The method of the disclosure includes dripping a nanomaterial solvent into a container filled with water whereby the nanomaterial being dripped collects at the air-water interface to produce the large-area monolayer. In one embodiment, different nanomaterial solvents can be dripped, at predetermined intervals such that the resulting large-area monolayer includes at least two different nanomaterials.

In one aspect of the disclosure, there is provided a method of producing a large-area monolayer of solvent dispersed nanomaterials including dispersing nanomaterials in a water immiscible solvent to produce a nanomaterial solvent mixture; dripping, at predetermined time intervals, single drops of the nanomaterial solvent mixture into a water-filled container; and retrieving the large-area monolayer from the container.

In another aspect, dispersing the nanomaterials includes dispersing nanoparticles or nanotubes into the water immiscible solvent. In one aspect, the nanoparticles include conductor nanomaterials, semiconductor nanomaterials or insulator nanomaterials. The water immiscible solvent may be selected from chloroform, 1,2-dicholoroethane, dichloromethane, benzene, isopropanol or water.

In a further aspect, retrieving the large-area monolayer includes draining water from the water-filled container; and lifting the monolayer out of the container.

In yet another embodiment, a second nanomaterial solvent mixture is produced and dripped at predetermined time intervals into the water-filled container; wherein the nanomaterial solvent mixture and the second nanomaterial solvent mixture are dripped at different times.

In another aspect, the disclosure includes removing the monolayer via horizontal precipitation or barrier-free deposition; and dripping a binder material into the water-filled container to retain shapes formed by the dripping of the nanomaterial solvent mixture. In yet another aspect, dispersing nanomaterials in a solvent to produce a nanomaterial solvent mixture is performed via stirring, mixing, ultrasonication (bath or probe), ball milling, chemical exfoliation, electrochemical exfoliation, mechanical exfoliation or homogenization. In yet a further aspect, dripping the nanomaterial solvent mixture is performed via horizontal precipitation or barrier-free deposition.

In a second aspect of the disclosure, there is provided apparatus for producing a large-area monolayer of solvent dispersed nanomaterials including a water-filled container; at least two different solvent dispersed nanomaterial solvent mixtures; and a dripping apparatus for dripping the at least two different solvent dispersed nanomaterial solvent mixtures, at predetermined time intervals, into the water-filled container.

In yet another aspect, each of the at least two solvent dispersed nanomaterial solvent mixtures includes nanoparticles or nanotubes; and an immiscible solvent. In one aspect, the nanoparticles include conductor nanomaterials, semiconductor nanomaterials or insulator nanomaterials. In a further aspect, the system includes a binder dripping apparatus for dripping a binder into the water filled container.

In yet a further aspect, the system further includes a substrate located at a bottom of the water filled container for lifting the monolayer out of the container when completed. In another aspect, the dripping apparatus includes a nozzle; and a set of tubing connecting the nozzle to a supply of one of the at least two nanomaterial solvent mixtures. The dripping apparatus may further include a syringe pump for dripping the nanomaterial solvent mixture.

In a third aspect of the disclosure, there is provided a large area monolayer film including a patterned first nanomaterial generated via a dripping process into a water-filled container; and a patterned second nanomaterial generated via a dripping process into a water-filled container; wherein the first and second nanomaterial abut each other.

In another aspect, the large area monolayer film further includes a binder for protecting the patterned first and second nanomaterials.

BRIEF DESCRIPTION OF THE DRAWINGS

Reference will now be made by way of example only to preferred embodiments of the disclosure by reference to the following drawings in which.

DETAILED DESCRIPTION OF THE EMBODIMENTS

The disclosure is directed at a large-area monolayer or monolayer film of solvent or solution, dispersed nanomaterials and a method and apparatus for producing same. In one embodiment, the nanomaterials are solvent dispersed two-dimensional (2D) nanomaterials, however, the nanomaterials may also be one-dimensional (1D) nanotubes). In some embodiments the nanomaterials may be exfoliated. Other films, such as, but not limited to, patterned films and multi-layer films (pattered or not) are also contemplated. In one embodiment, the films are generated at the air-water interface in a water-filled container via a process amenable to the coating of a large area substrate by batch processing by continuous roll-to-roll transfer.

In a preferred embodiment, the disclosure describes a method of assembling the nanomaterials into tiled films where the nanomaterials are associated edge-to-edge or are partially overlapping to produce the monolayer film.

Figure 1A:
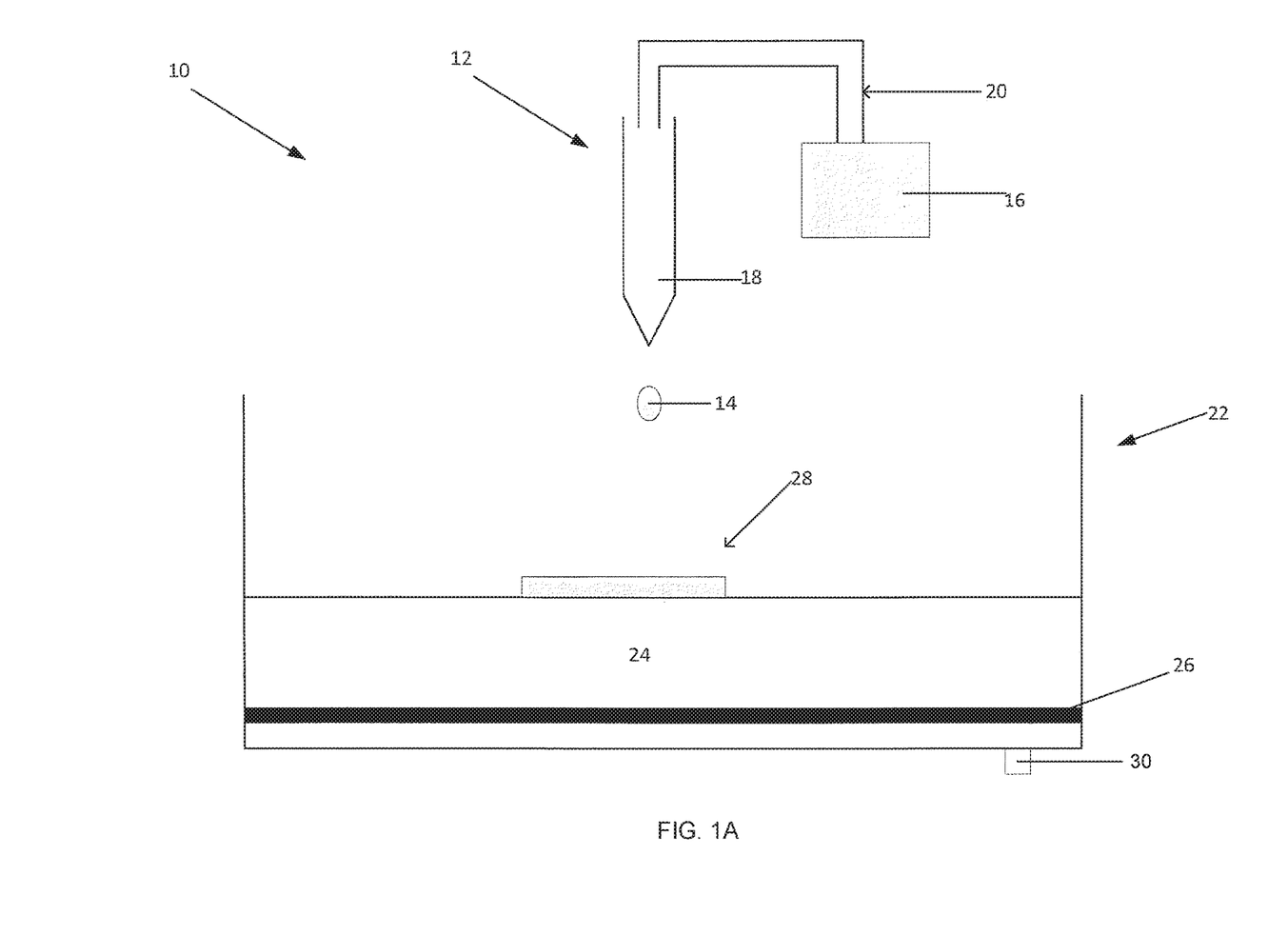
FIG. 1A is a schematic diagram of apparatus for producing a large-area monolayer of nanomaterials.

Turning to FIG. 1A, a schematic diagram of apparatus for forming a large-area monolayer of solvent dispersed nanomaterials is shown. In the current embodiment, 2D nanomaterials are used. The apparatus 10 includes a dripping apparatus 12 for dripping drops 14 of a nanomaterial solvent mixture 16 at predetermined time intervals. In one embodiment, the dripping apparatus 12 includes a syringe or nozzle 18 attached to tubing 20 which is connected to supply the nanomaterial solvent mixture 16. In another embodiment, the dripping apparatus 12 includes a syringe pump.

The apparatus 10 further includes a container 22, such as a trough containing a liquid 24, such as water. A substrate 26 is preferably located within the trough 22 for removing a large-area monolayer film 28 when required. The substrates used to deposit the monolayers and multilayers of patterned (or not) materials may be flexible substrates composed of polymers such as, but not limited to, polyethylene terephthalate, polyethylene imide, polycarbonate, polymethylmethacrylate, polystyrene, etc. or semiconductors such as silicon or germanium or insulating glasses such as silica, quartz, alumina, etc. The substrates may also be patterned via other methods prior to or after the deposition of the films described above.

The container 22 may also include a spout or drain 30 for releasing the water from the container 22 in order to facilitate removal of the monolayer film 28.

Figure 1B:
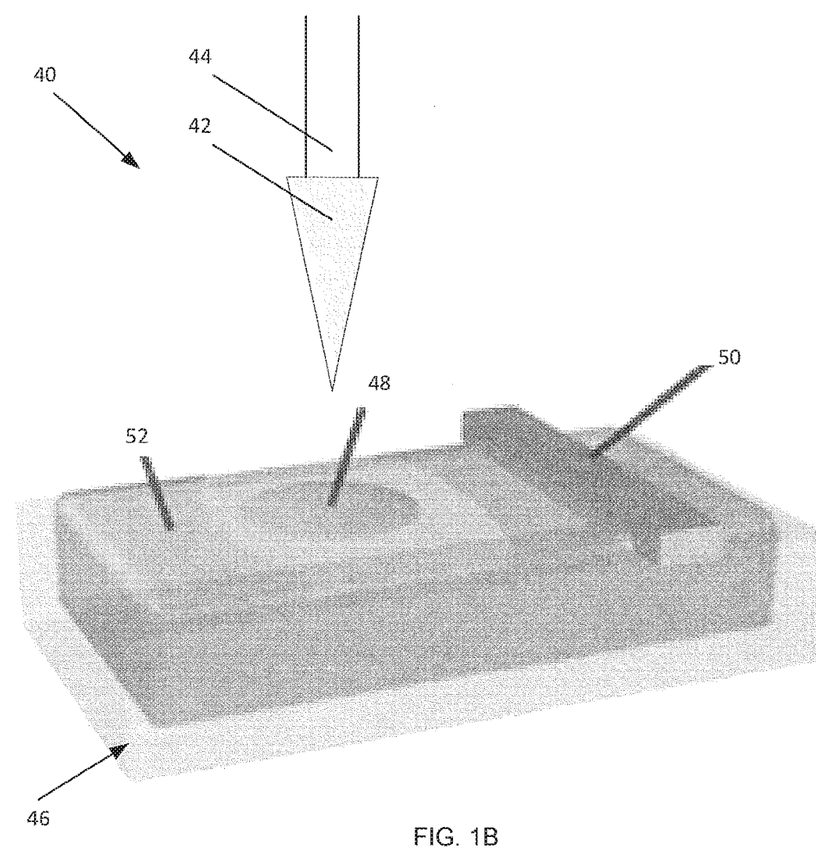
FIG. 1B is a schematic diagram of another embodiment for producing a large-area monolayer of nanomaterials.

FIG. 1B is a schematic diagram of another embodiment of apparatus for forming a large-area monolayer. The apparatus of FIG. 1B can be seen as a barrier-free deposition process. In the embodiment of FIG. 1B, the apparatus includes a dripping apparatus 40 including a nozzle portion 42 and tubing 44. Although not shown, the other end of the tubing is connected to a supply of nanomaterial solvent (not shown) which is dripped into the container 46.

Rather than having the nanomaterials 48 spread out over the entire surface of the container 46, the apparatus 40 includes a fixed barrier 50 for better controlling the size of the monolayer being produced within the water 52 at the air-water interface. Although not shown, the apparatus of FIG. 1B may also include a substrate within the container 46 along with a drain for releasing the liquid from the container so that the monolayer can be more easily removed.

Figure 1C:
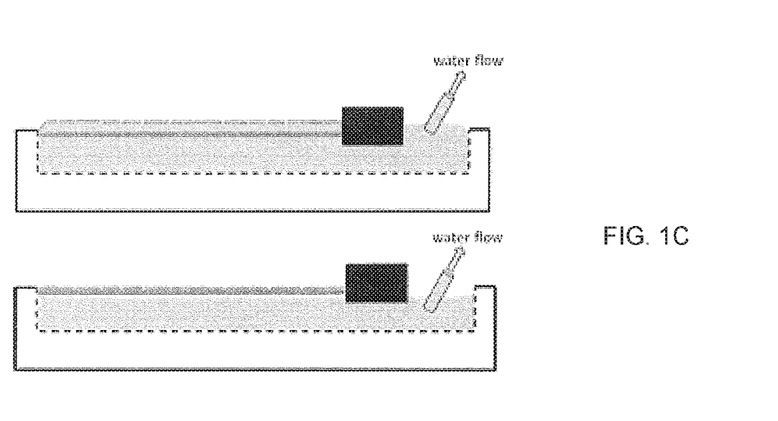
FIG. 1C is a schematic diagram of yet a further embodiment for producing a large-area monolayer of nanomaterials.

Turning to FIG. 1C, yet another embodiment of apparatus for forming a large-area monolayer is shown in cross-section. The apparatus shown in FIG. 1C can be seen as a horizontal precipitation method. A substrate is placed beneath the water surface either before or after film deposition. The monolayer is transferred to the substrate by draining out the water using a drain or aspiration pump. As the water drains, the monolayer moves downwards until it reaches the surface of the substrate which remains stationary with respect to the bath itself.

Figure 1D:
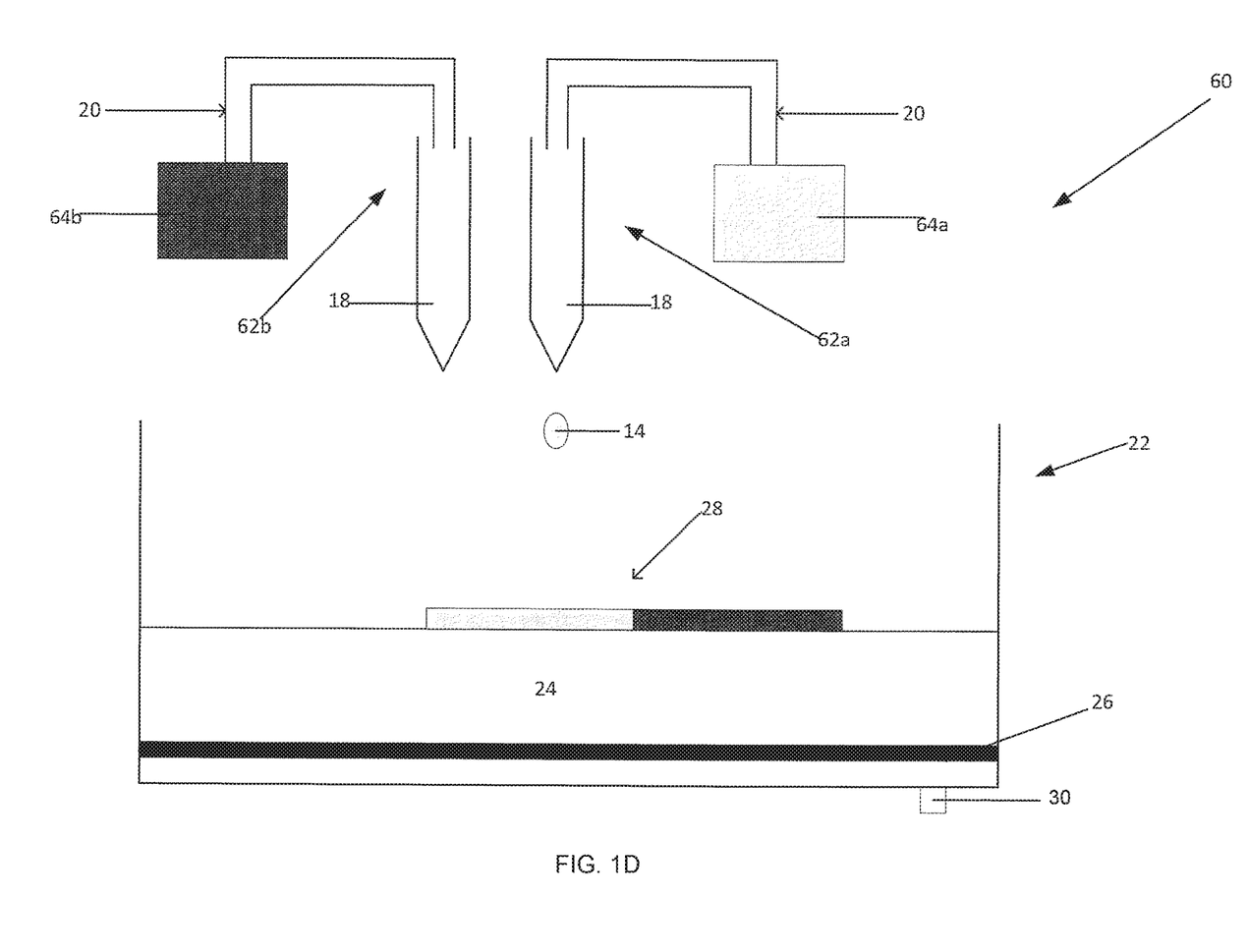
FIG. 1D is a schematic diagram of yet a further embodiment for producing a large-area monolayer of nanomaterials.

Turning to FIG. 1D, a schematic diagram of another embodiment of apparatus for forming a large-area monolayer of 2D nanomaterials is shown. In this embodiment, the apparatus 60 includes a pair of dripping apparatus 62a and 62b for dripping two different nanomaterial solvent mixtures 64a and 64b. As with the embodiment of FIG. 1B, each dripping apparatus includes a syringe or nozzle 18 attached to tubing 20 which is connected to supply its associated nanomaterial solvent mixture 64a or 64b. It will be understood that while only two dripping apparatus are shown, any number of dripping apparatus (preferably equal to the number of different nanomaterial solvent mixtures) can be used.

In one embodiment, the dripping apparatuses 62a and 62b are preferably mounted to a frame that allows the two dripping apparatuses to be moved with respect each other such that there is a common dripping point. This automation will be understood by one skilled in the art.

The dripping apparatuses 62a and 62b preferably drip during alternative time periods such that the different nanomaterials do not mix with each other whereby the monolayer has at least two distinct areas. This will be described in more detail below.

In another embodiment, one of the dripping apparatus 62a can be used for dripping the nanomaterial solvent mixture while the other dripping apparatus 62b can be seen as a binder applying nozzle that is used to add a binder to the monolayer to assist in retaining the shape of the patterns formed. Although not shown, it will be understood that there may be more than one dripping apparatus for dripping different nanomaterial solvent mixtures along with a dripping apparatus for applying the binder.

In one embodiment, when the dripping apparatus is used as a binder applying nozzle, the nozzle sprays a polymer solution that adheres to floating nanomaterial layer in order to create a desired pattern before further nanomaterial solvent mixture is dripped. As such, nanomaterial that is not bound together can be removed, such as by an air stream or an aspirator, before the next nanomaterial is dripped. In another embodiment, the nanomaterial may be functionalized at the edges with a light responsive material designed to crosslink in the bath upon light exposure whereby the light is used to solidify the pattern in the densely tiled monolayer before starting to add the next layer of nanomaterial.

Figure 2A:
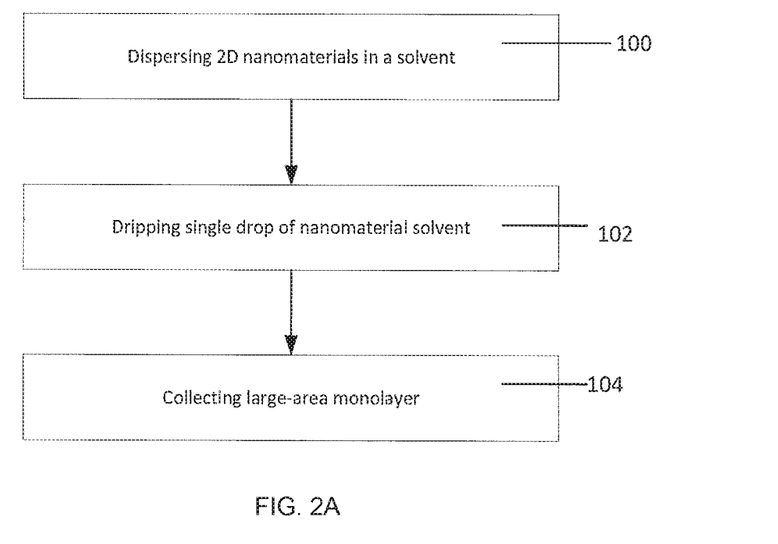
FIG. 2A is a flowchart outlining a method of producing a large-area monolayer film of nanomaterials.

Turning to FIG. 2A, a flowchart outlining a method of forming a large-area monolayer of solvent dispersed nanomaterials is shown. Initially, nanomaterials, such as, but not limited to, nanoparticles or nanotubes are dispersed or dissolved (100) into a solvent that is preferably immiscible, or mostly immiscible with a liquid, such as water. This mixture may be seen as a nanomaterial solvent mixture. The dispersion may be prepared by known processes such as, but not limited to, stirring, mixing, ultrasonication (bath or probe), ball milling, chemical exfoliation, electrochemical exfoliation, mechanical exfoliation or homogenization. In a preferred embodiment, the resulting flakes of nanomaterial are preferably on the nanometer scale with respect to thickness (0.3 to 100 nm) while being micro-sized (approximately 0.1 to 100 micrometers).

In one embodiment, the nanomaterials are graphene based, however, other nanoparticles can be used to produce the large-area monolayer. Examples of nanomaterials include, but not limited to, conductor nanomaterials, semiconductor nanomaterials or insulator nanomaterials. Examples of conductor nanomaterials include, but are not limited to, gold nanoplates, silver nanoplates, $NbSe_2$, $TaSe_2$, graphene, reduced graphene-oxide (rGO), $WSe_2$ and the family of MAX phases also known as MXenes. Single and multi-walled carbon nanotubes (CNTs), silver nanowires, etc. can also be used as conducting phases. Examples of semiconductor nanomaterials include, but not limited to, $MoS_2$, $WS_2$, $MoSe_2$, $MoTe_2$, $WTe_2$, $ZrS_2$, $ZrSe_2$, semiconducting black phosphorous (BP) and 2D perovskites. Insulator nanomaterials include, but are not limited to, graphene-oxide (GO), hexagonal boron nitride (HBN), layered alumino-silicates, and hydroxides. With respect to the solvent, different solvents may also be used, such as, but not limited to, ethanol, methanol, 2-isopropyl alcohol, N,N-dimethylformamide, N-methyl pyrrolidone, acetonitrile, diethyl ether, cholorobenzenes, hexanes (all isomers), volatile long chain alcohols, aliphatic hydrocarbon, acetone, chloroform, 1,2-dicholoroethane, dichloromethane, benzene, isopropanol, water and combinations of these solvents. In a preferred embodiment, when two or more solvents are used, the resulting mixed solvent should be miscible.

In one embodiment, the graphene oxide may be prepared according to the methods of Brodie, Staudenmeier, Hummers or the various modified/improved Hummers methods such as that of Tour with the resulting slurry mixed with ethanol to produce the nanomaterial solvent mixture. In an alternative embodiment, this nanomaterial solvent mixture may be further diluted with 1,2-dicholoroethane (DCE) to achieve a nanomaterial solvent mixture at a desired concentration with a volume ratio of ethanol/DCE of 1:13.

After the nanomaterial solvent mixture has been produced, drops of the nanomaterial solvent mixture, at predetermined intervals, may be dripped into a liquid filled container, such as a water-filled container (102). Other liquids can be used as long as the nanomaterial solvent mixture is able to spread spontaneously when dripped onto the liquid in the container. For instance, the criteria for spreading may require the surface tension of the liquid in the container to be much greater than that of the solvent or solvent mixture containing the nanomaterial. Whether a liquid will spread on another can be determined by the spreading coefficient. The drops may be dripped using the dripping apparatus. Prior to the start of the dripping process, the air-water interface may be cleaned using an aspirator to improve the monolayer film generation or production. In some embodiments, flat substrates such as mica and/or clean polyethylene terephthalate (PET) can be prepositioned in the water to be coated by either dip coating or the horizontal precipitation method.

Figure 3A:
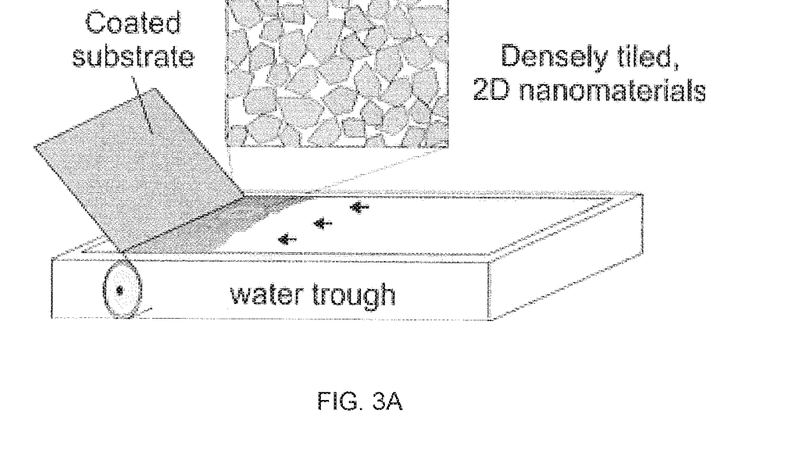
FIG. 3A is a schematic diagram of another embodiment of apparatus for producing a large-area monolayer of nanomaterials.

As the drops hit the water, a large-area monolayer film of the 2D nanomaterials starts to be created at the air-water interface, or surface of the water, within the water-filled container. It is preferable that the container has a relatively large surface area. As each drop of the nanomaterials solvent mixture contacts the surface of the water, or the air-water interface, the nanomaterial solvent mixture typically spreads spontaneously due to the positive spreading coefficient, and then the solvent evaporates, leaving the nanomaterials floating at the air-water interface thereby producing a film of nanomaterials, such as in the form of a large-area monolayer. Dripping is continued, at predetermined time intervals, until the nanomaterial-solvent mixture could no longer spread as indicated by the formation of a lens of the solvent under the dripping position. A schematic diagram of a large-area monolayer produced using this method is shown in FIG. 3A.

In another embodiment, the monolayer film can be deposited on a substrate at the same time as deposition. In this case, the nanomaterial solvent is continuously dripped and the substrate is withdrawn from the bath at a rate which matches the growth rate of the film. FIG. 3A schematically illustrates this process whereby the film can be continuously transferred to substrates of arbitrary length but a width smaller than the bath or container, in a manner that is compatible with roll-to-roll processing. In order to effectively push the material onto the substrate, the spreading pressure of the solvent itself might be used or the movement of fluid such as air or the liquid in the aqueous coating bath which can transfer a drag force to the growing film in order to facilitate coating.

After it is determined that there is no more spreading being done by the 2D nanomaterials, the large-area monolayer can be collected (104). The resulting film is then deposited onto the substrates within the container and beneath the film by removing the water from the container. In other words, by draining the water from the container, such as via the drain, the film is lowered onto the pre-positioned substrate. The film, or large-area monolayer can then be lifted out of the container by lifting the substrate out of the container. Dip coating or free-withdrawal coating, where a substrate is slowly pulled from or submerged into the bath can also be used to deposit the film onto various substrates. Another convenient method to coat substrates is the stamp transfer or the Langmuir-Schaffer method where a substrate is contacted to the top of the film at the air-film side. In order to facilitate transfer to the substrate, suitable surface modification of the substrate may be necessary to facilitate wetting or improved adhesion by methods commonly used by those skilled in the art.

Figure 2B:
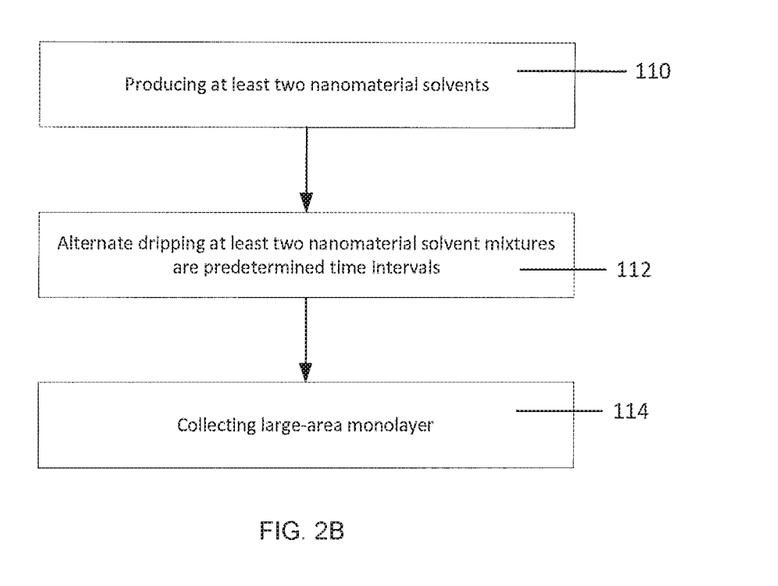
FIG. 2B is a flowchart outlining another method of producing a large-area monolayer film of nanomaterials.

Turning to FIG. 2B, a flowchart outlining another method of producing a large-area monolayer film is shown. Initially, at least two different nanomaterial solvent mixtures are produced (110). The makeup of the different nanomaterial solvent mixtures are determined by the desired resulting monolayer characteristics. Then, at least two different nanomaterials solvent mixtures may also be pre-prepared whereby they are simply obtained from a source. In one embodiment, the apparatus shown in FIG. 1D may be used to implement the method of FIG. 2B.

Then, at least two nanomaterial solvent mixtures are then dripped into a liquid-filled container at predetermined time intervals (112). In one embodiment, a first dripping apparatus 62a is moved into place such that its associated nanomaterial solvent mixture is dripped for a first time interval whereby during this first time interval, the nanomaterial produces a first distinct area of a large-area monolayer film. After the first time interval elapsed, the second dripping apparatus 62b can be moved into place such that the second nanomaterial solvent mixture can be dripped into the container for a second time interval to produce a second distinct area of a large-area monolayer film. As with the method of FIG. 2, the dripping continues until the nanomaterials are no longer able to spread after being dripped into the container. The first and second time intervals may be set such that there are only two distinct areas within the large-area monolayer film or multiple time intervals may be set such that the monolayer film has multiple alternative areas of the first and second nanomaterials. Furthermore, large-area monolayer films comprising more than two different nanomaterials can also be produced. A schematic diagram showing a large-area monolayer film with three different distinct nanomaterial areas is shown in FIG. 3B.

Figure 3B:
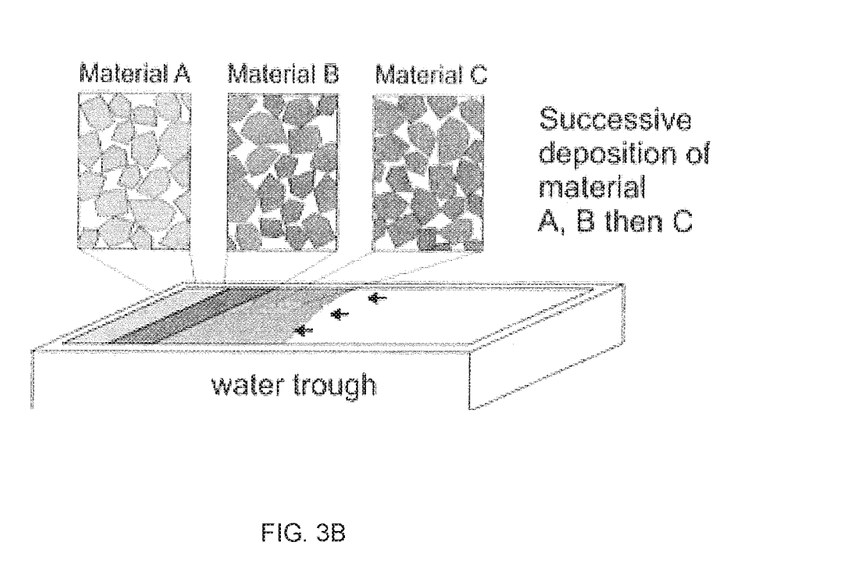
FIG. 3B is a schematic diagram of yet another embodiment of apparatus for producing a large-area monolayer of nanomaterials.

In another embodiment, the abovementioned procedures can be used but dispersions of different materials are added in sequence to deposit material in layers as illustrated in FIG. 3b. As such a large area monolayer comprising at least two different nanomaterials. By producing a monolayer having different nanomaterials, these monolayers may be patterned with different electronic or optoelectronic designs to create functional circuits such as, but not limited to, various electrical, optoelectronic or thermoelectronic components. As an example, 2D nanomaterial A might be added first to the coating bath which would form a densely tiled film of nanomaterial A. The nanomaterial solvent mixture being dripped can then be changed to nanomaterial B which will grow from the deposited film of nanomaterial A. Depending on the desired design of the monolayer, the nanomaterial solvent mixtures can be continuously switched to make narrow bands of an arbitrary number or combination of 2D nanomaterials. In order to reduce or prevent mixing between two different nanomaterial films, it might be beneficial to modify the nanomaterials by a suitable cross-linking chemistry to hold the film together more strongly as additional material is added. Linking the discrete sheets edge-to-edge through covalent or ionic bonding prevents movement of the film components. If the chemical cross-linking can be induced by application of light irradiation, the film could be patterned using a moveable and focused light source to create patterns of crosslinked linked film. Non crosslinked material can be removed by jets of air and vacuum suctioned to remove this material from the interface. The next material added to the container would fill in the gaps of the patterned film which could also then be patterned using a similar method. The process can be repeated to make any useful shapes or patterns to create electronic or optoelectronic circuits and other devices. In another embodiment, the abovementioned procedures can be used to deposit a second or third or arbitrary number of layers (patterned or not) onto a suitable substrate. It is important to sufficiently dry the films prior to further depositions to reduce or prevent the prior film from floating off when it is again submerged in the coating bath. In an alternative embodiment, use of a dripping apparatus, such as disclosed above, for delivering a binder to the monolayer film is contemplated.

After the large-area monolayer film has been completed, it can be collected (114) or removed from the container.

The large-area monolayers of the current disclosure may find use in different applications as will be understood by one skilled in the art. For instance, in one application, or use, reduced GO (rGO) monolayers coated silver (Ag) nanowire electrodes may be created. Ag nanowire electrodes can be initially coated by the GO monolayer and then dried in a vacuum to remove adsorbed water. The electrodes can then be immersed in a heated solution of sodium borohydride (NaBH$_4$) and water to convert the insulating GO to conducting rGO and then rinsed.

Figure 4:
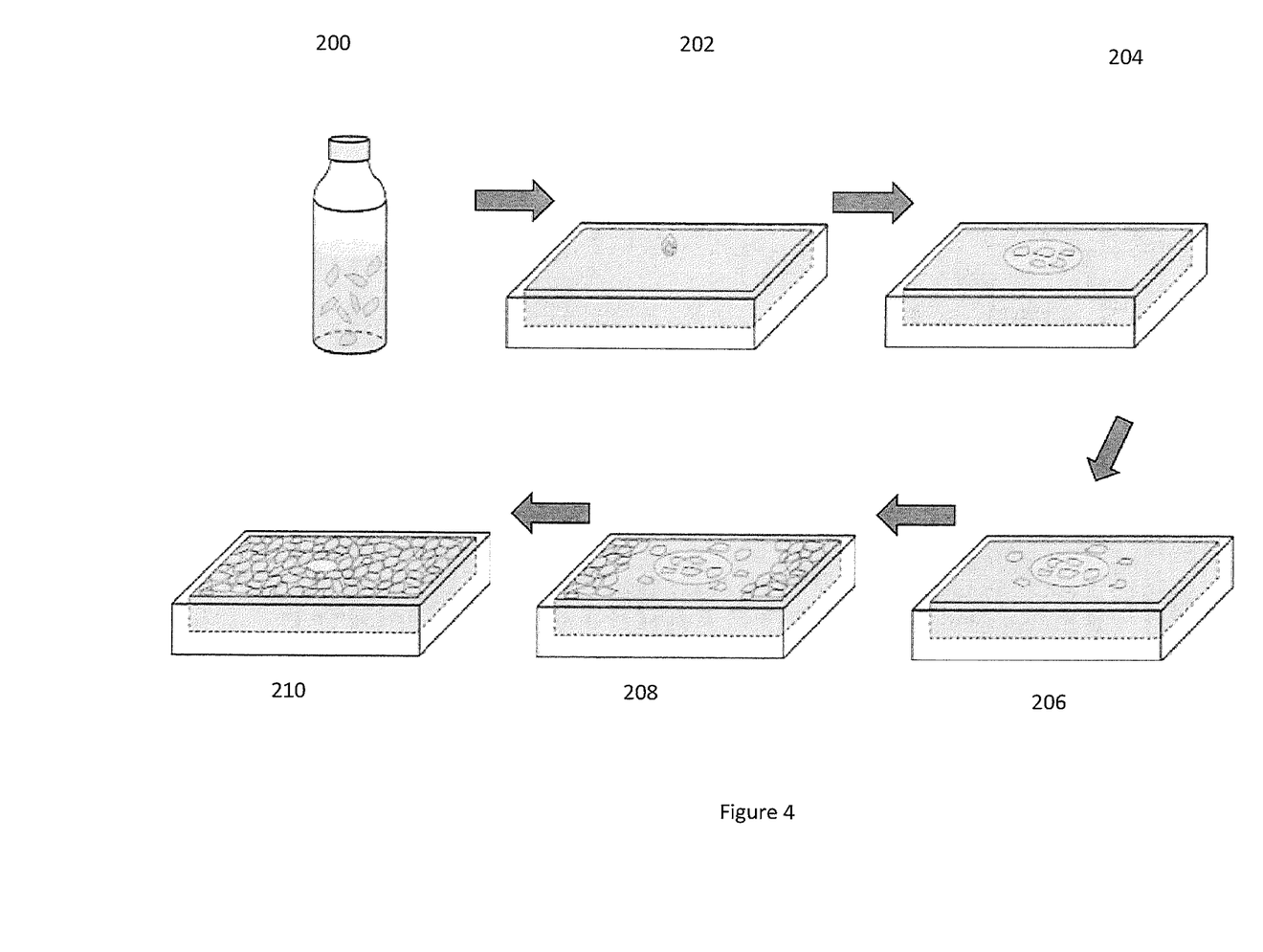
FIG. 4 is a schematic diagram of a process for producing a large-area monolayer of nanomaterials.

Turning to FIG. 4, a set of schematic diagrams showing a large-area monolayer production or creation process is provided. As schematically shown in FIG. 4, the 2D nanomaterial is initially dispersed in a dispersion solvent (200) to produce a nanomaterial solvent mixture. This nanomaterial solvent mixture is then dripped into a bath (202) containing an aqueous solvent. In one example, this bath may be a water-filled container. In a preferred embodiment, the bath containing the aqueous solvent is free of any residues that might adsorb at the air-water interface as such material may impede or negatively affect the production of the large-area monolayer film. When water is used in the bath, it is preferable to use a water-immiscible liquid as the dispersing solvent as this reduces or prevents mixing of the 2D nanomaterial with the water in the bath which may cause loss of nanomaterial and reduce transfer efficiency. In situations where it may not be possible to find a dispersion solvent that is immiscible with water and is capable of dispersing the 2D nanomaterial, mixed solvents may be used as the dispersion solvent where at least one solvent is water immiscible and at least one solvent is miscible but can help to improve the transfer efficiency. In another embodiment, a water miscible solvent can be used with the expectation of some material loss in the dripping stage or phase. Another preferred characteristic for the dispersion solvent is that it spontaneously spreads when dripped at the air-water interface. For those skilled in the art, such solvents have a spreading coefficient (S) or S<0.

The concentration of the dispersion solvent used depends on the specific surface area of the 2D nanomaterial but typically ranges from approximately 0.01 mg/mL to 100 mg/mL and is adjusted to reduce or prevent discrete sheets or nanomaterials from overlapping with each other upon spreading of a drop of the nanomaterial solvent mixture at the air-water interface.

The nanomaterial solvent mixture is preferably dripped onto the air-water interface (or into the bath) by a dripping apparatus capable of pumping liquid at a controlled rate through a tube made of a material that does not dissolve or degrade significantly in the dispersing solvent. Preferably the drops of nanomaterial solvent mixture are deployed or dripped close to the air-water interface but should drop from the nozzle or dripping apparatus before the drop of nanomaterial solvent mixture touches the water. The rate of dripping is preferably adjusted to reduce or prevent significant evaporation of the drop before it falls from the tube.

As schematically depicted in 204 of FIG. 4, once the drop falls onto the air-water interface it will spread into a thin film of solvent which carries the 2D nanomaterial with it. Drops are continuously dripped (at predetermined time internals) such that the 2D nanomaterial continues to spread at the air-water surface (as schematically shown in 206). Upon evaporation of the dispersion solvent (or its dissolution into the water), a plurality of 2D nanomaterial is left floating at the air-water interface (208). As each drop is dripped, the spreading front of dispersion solvent pushes the previously deposited 2D nanomaterial to the extremities of the coating bath with a force that is dictated by the spreading pressure of the dispersion solvent at the air-water interface. This typically depends on the interfacial tensions of gas-liquid and liquid-liquid interfaces formed during the process. This process is repeated until a dense film or monolayer film begins to grow from the edges of the bath towards the center as illustrated in 210 of FIG. 4.

In one embodiment, this film can be grown until it covers the entire surface area of the bath (or container) through repetitive dripping as shown in 210 of FIG. 4. It may be determined that the film is nearly finished growing or being produced as the dispersion solvent no longer spreads at the air-water interface because the spreading coefficient becomes larger than zero. The resulting film of nanomaterial, which spans the dimensions of the bath can be transferred to a substrate such as discussed above.

In another embodiment, the liquid in the bath may be non-aqueous in nature. However, in practice, water is preferred due to safety and cost.

Figure 5:
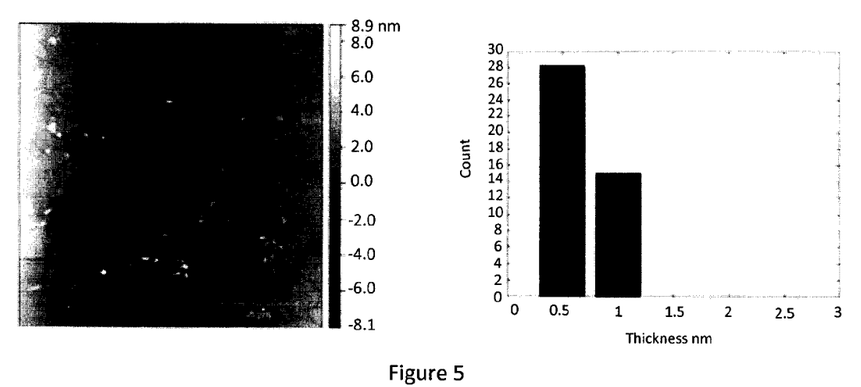
FIG. 5 is an atomic force microscopy image (left) of a graphene oxide monolayer deposited on a mica substrate and a thickness distribution if the densely tiled monolayer (right) indicating that this film is approximately 0.5-1 nm in thickness over the entire substrate.
Figure 6:
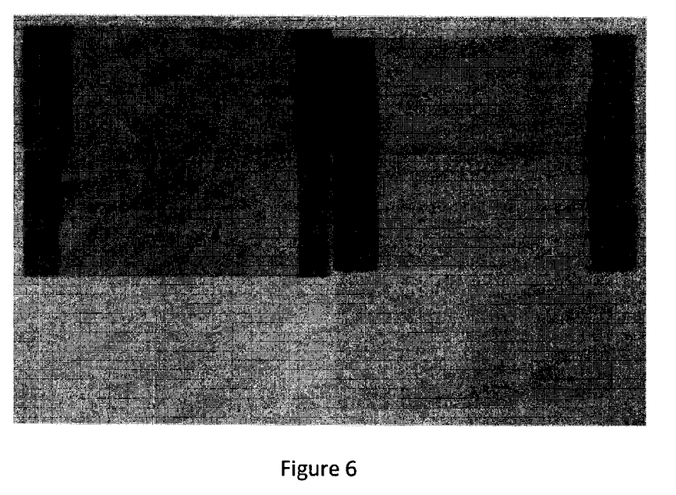
FIG. 6 shows an example of the coating formed on the mica substrate after drying.

In a more specific example (seen as Example A), graphene oxide may be prepared by the Tour method and left in ethanol after washing. This mixture can then be diluted in ethanol, probe ultrasonicated to exfoliate the sheets and mixed with 1,2-dichloroethane to create a nanomaterial solvent mixture with a concentration of approximately 0.025 mg/ml and an ethanol to 1,2-dichloroethane ratio of 1:13. The nanomaterial solvent is then loaded into a syringe pump and dripped at a rate of 0.1 mL/min onto a water bath from a tube made of polytetrafluoroethylene. Dripping is continued until the drops no longer spread at the air-water interface. As graphene oxide is transparent, it may be difficult to observe visually the growth of the film except that the interface between the growing film and the air-water interface is apparent when each drop spreads and moves inwards as the film grows. Prior to film deposition, muscovite mica and polyethylene terephthalate substrates may be placed in the water bath. An aspirator may then be used to withdraw water until the film is lowered onto the substrates. FIG. 5 shows an example of the coating formed on the mica substrate after drying In this example, the film is nearly monodisperse in thickness between 0.5 and 1 nm indicating they are single sheets of graphene oxide. In experiments, coating substrates at various areas within the bath and Brewster angle microscopy confirmed the film is continuous over the entire bath area. As can be seen in FIG. 5, which is an atomic force microscopy image of the deposited film, the densely tiled sheets generally have a thickness of about 1 nm. The graph beside the image is a histrogram of sheet thickness illustrating that the film is composed almost entirely of material that is approximately 1 nm in thickness.

In another specific example (seen as Example B), the films transferred to polyethylene terephthalate, as described above, were exposed to the reducing agent, hydrogen iodide (HI). This caused the GO to be converted to rGO, a defective and functionalized form of graphene. The film becomes slightly darker compared to the bare substrate. The films were determined to be electrically conductive with a resistivity of about 100 kOhms/sq. and are thus suitable for creating large area transparent electrodes. This example also compares two substrates coated at two different dispersion concentrations. When the concentration is too high, the material overlaps during each drop and creates a wrinkled film whereas the lower concentration is uniform.

Figure 7:
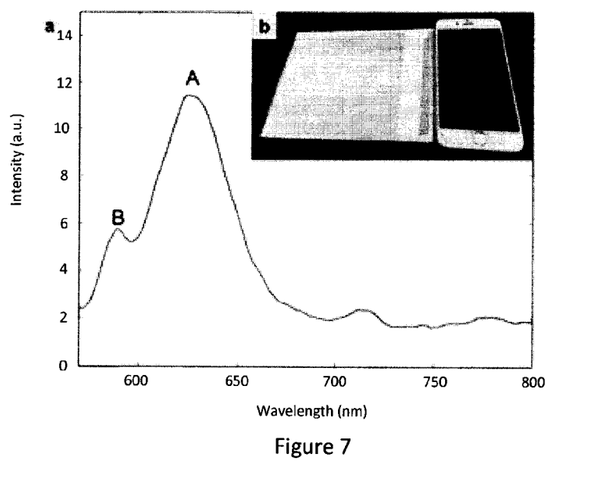
FIG. 7 shows the photoluminescence spectra of a film of $MoS_2$ deposited on glass with an inset showing a photograph of the large area $MoS_2$ monolayer deposited on glass in comparison to a cell phone.

In yet another example (seen as example C), molybdenum disulphide ($MoS_2$) was exfoliated by exposing the bulk $MoS_2$ powder to n-butyllithium. Once fully intercalated, the material was exposed to water which caused its rapid exfoliation. The material was centrifuged, washed and transferred to dimethylformamide and mixed 1:1 with 1,2-dichlorethane to create a dispersion concentration of 0.1 mg/mL for the nanomaterial solvent. The film was created in the same way as described in Example A for graphene oxide except using the $MoS_2$ dispersion. The film was coated onto a glass substrate using the method described in Example A. The film was heat treated at 150 degrees Celsius for several hours under flowing nitrogen to convert the material from the metallic 1T phase of $MoS_2$ to the semiconducting 2H phase. FIG. 7 shows that the film is transparent but exhibits photoluminescence that indicates the film is a direct band gap semiconductor. The picture shows that a small coating bath can create uniform coatings larger than a large-screen cell phone.

In yet another example (seen as Example D), graphene oxide films were deposited as described in Example A, onto polyethylene terephthalate substrates coated with silver nanowires (AgNWs). The graphene oxide is converted to reduced graphene oxide as described in Example B. Such AgNW electrodes are currently being used in commercial displays but suffer from poor lifetimes due to rapid oxidation of the AgNWs under high currents. FIG. 12 shows the results of lifetime testing of transparent conductors with bare AgNWs compared to one the transparent conductors coated with reduced graphene oxide. The resistance ($R/R_0$) increases rapidly after only 2 days of heating while the modified electrodes are stable for more than two weeks. These results demonstrate the utility of the films as transparent blocking layers which prevent AgNW corrosion but have applications in many other areas.

It will be appreciated by those skilled in the art that various modifications and alterations can be made to the present invention without departing from the scope of the invention as defined by the appended claims. Some of these have been suggested above and others will be apparent to those skilled in the art.

In the preceding description, for purposes of explanation, numerous details are set forth in order to provide a thorough understanding of the embodiments; however the specific details are not necessarily required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A coated substrate comprising:
A) a large-area monolayer film comprising a monolayer of nanomaterials comprising:
a first nanomaterial generated via a dripping process onto an air-water interface in a water-filled container, the first nanomaterial comprising graphene oxide having a thickness in a range of approximately 0.5-1 nm as measured by atomic force microscopy;
a second nanomaterial generated via a dripping process onto the air-water interface in the water-filled container, the second nanomaterial comprising $MoS_2$; and,
B) a solid substrate layer on which the monolayer film is deposited,
wherein the first nanomaterial and the second nanomaterial abut each other edgewise to form an edge-to-edge interface between the first nanomaterial and the second nanomaterial, and
wherein the substrate has an arbitrary length and the first nanomaterial and the second nanomaterial are successively arranged on the substrate along the length of the substrate with the edge-to-edge interface disposed width-wise on the substrate.

2. The coated substrate of claim 1 further comprising:
a binder for protecting the first and second nanomaterials.

3. The coated substrate of claim 1 wherein the first nanomaterial is patterned.

4. The coated substrate of claim 1 wherein the secondary nanomaterial is patterned.

5. The coated substrate of claim 1 further comprising at least one other nanomaterial generated via a dripping process onto the air-water interface in the water-filled container wherein the at least one other nanomaterial abuts edgewise at least one of the first nanomaterial or the second nanomaterial on the substrate.

6. The coated substrate of claim 1 wherein a thickness of the second nanomaterial is between 0.3 and 100 nm.

7. The coated substrate of claim 1 further comprising a coating over at least one of the first and second nanomaterials.

8. The coated substrate of claim 7 wherein the coating is over a portion of the at least one of the first and second nanomaterials.

* * * * *

UNITED STATES PATENT AND TRADEMARK OFFICE
CERTIFICATE OF CORRECTION

| | |
|---|---|
| PATENT NO. | : 10,875,052 B2 |
| APPLICATION NO. | : 16/308647 |
| DATED | : December 29, 2020 |
| INVENTOR(S) | : Michael A. Pope, Luzhu Xu and Yefeng Zhang |

It is certified that error appears in the above-identified patent and that said Letters Patent is hereby corrected as shown below:

On the Title Page

Item [72] delete "Xu Luzhu" and insert --Luzhu Xu--

Signed and Sealed this
Seventh Day of February, 2023

Katherine Kelly Vidal
*Director of the United States Patent and Trademark Office*